United States Patent
Lee et al.

(10) Patent No.: US 8,564,141 B2
(45) Date of Patent: Oct. 22, 2013

(54) CHIP UNIT AND STACK PACKAGE HAVING THE SAME

(75) Inventors: Kyu Won Lee, Seoul (KR); Cheol Ho Joh, Seoul (KR); Eun Hye Do, Suwon-si (KR); Ji Eun Kim, Suwon-si (KR); Hee Min Shin, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 146 days.

(21) Appl. No.: 13/038,831

(22) Filed: Mar. 2, 2011

(65) Prior Publication Data

US 2011/0272798 A1    Nov. 10, 2011

(30) Foreign Application Priority Data

May 6, 2010    (KR) .................. 10-2010-0042453

(51) Int. Cl.
*H01L 23/48* (2006.01)

(52) U.S. Cl.
USPC ........... 257/784; 257/691; 257/684; 257/686; 257/690; 257/E21.506

(58) Field of Classification Search
USPC .......... 257/691, E23.141, 784, 684, 686, 690, 257/675, E21.506, E23.031; 438/122
See application file for complete search history.

(56) References Cited

U.S. PATENT DOCUMENTS

| | | | | | |
|---|---|---|---|---|---|
| 5,331,235 | A | * | 7/1994 | Chun | 257/777 |
| 5,483,024 | A | * | 1/1996 | Russell et al. | 174/529 |
| 5,508,565 | A | * | 4/1996 | Hatakeyama et al. | 257/777 |
| 5,530,292 | A | * | 6/1996 | Waki et al. | 257/724 |
| 5,818,107 | A | * | 10/1998 | Pierson et al. | 257/723 |
| 5,994,166 | A | * | 11/1999 | Akram et al. | 438/108 |
| 6,020,629 | A | * | 2/2000 | Farnworth et al. | 257/686 |
| 6,051,878 | A | * | 4/2000 | Akram et al. | 257/686 |
| 6,552,423 | B2 | * | 4/2003 | Song et al. | 257/679 |
| 6,566,760 | B1 | * | 5/2003 | Kawamura et al. | 257/777 |
| 7,880,179 | B2 | * | 2/2011 | Bieck et al. | 257/82 |
| 8,026,586 | B2 | * | 9/2011 | Kim | 257/686 |
| 8,399,998 | B2 | * | 3/2013 | Kim et al. | 257/784 |
| 2008/0128900 | A1 | * | 6/2008 | Leow et al. | 257/723 |
| 2011/0193221 | A1 | * | 8/2011 | Hu et al. | 257/737 |

\* cited by examiner

*Primary Examiner* — Zandra Smith
*Assistant Examiner* — Tsz Chiu
(74) *Attorney, Agent, or Firm* — William Park & Associates Patent Ltd.

(57) ABSTRACT

A chip unit includes: a first semiconductor chip and a second semiconductor chip disposed such that their surfaces for forming first bonding pads and second bonding pads face each other; first and second connection members disposed on the surfaces of the first and second semiconductor chips for forming the first and second bonding pads, and having redistribution lines which have one ends connected with the first and second bonding pads and the other ends projecting beyond one edges of the first and second semiconductor chips and films; an adhesive member interposed between the first connection members and the second connection members; and via patterns passing through the adhesive member and connecting projecting portions of the redistribution lines of the first and second connection members with each other.

16 Claims, 7 Drawing Sheets

CHIP UNIT AND STACK PACKAGE HAVING THE SAME

CROSS-REFERENCE TO RELATED APPLICATIONS

The present application claims priority to Korean patent application number 10-2010-0042453 filed on May 6, 2010, which is incorporated herein by reference in its entirety.

TECHNICAL FIELD

The present invention relates to a chip unit and a stack package having the same, and more particularly, to a chip unit which can minimize the occurrence of warpage and failures such as cracks in a semiconductor chip, and a stack package having the same.

BACKGROUND OF THE INVENTION

Recently, as semiconductors are used in most electronic products with the development of the electronic industry, various sized and shaped semiconductor packages are used. Specifically, in small-sized electronic appliances and mobile products, semiconductor chips, which have a high processing speed, light weight and highly integrated, are increasingly used. Thus, semiconductor packages with appropriate sizes and shapes are used in these products.

Meanwhile, in order to realize high integration of a semiconductor device, a semiconductor chip is manufactured to have a small thickness, for example, approximately 50 μm or under. In this regard, as the thickness of the semiconductor chip decreases and an overhang increases, problems are caused in that bouncing occurs and bonding cannot be properly implemented using conductive wires. When implementing bonding by using conductive wires, that is, attaching conductive wires to a thin semiconductor chip ess, the semiconductor chip is likely to warp or break owing to its small thickness.

In addition, due to the decrease in the thickness of the semiconductor chip, failures such as cracks may result in the semiconductor chip during a semiconductor chip out process or a semiconductor chip pickup process for attaching the semiconductor chip.

As a consequence, not only is it difficult to form a semiconductor package using the semiconductor chip with the small thickness, but the productivity of the semiconductor package also markedly decreases.

BRIEF SUMMARY OF THE INVENTION

Embodiments of the present invention are directed to a chip unit which can minimize the occurrence of warpage and fails such as cracks in a semiconductor chip and a stack package having the same.

In one embodiment of the present invention, a chip unit includes: a first semiconductor chip and a second semiconductor chip disposed such that their surfaces for forming first bonding pads and second bonding pads face each other; first and second connection members disposed on the surfaces of the first and second semiconductor chips for forming the first and second bonding pads, and having redistribution lines which have one ends connected with the first and second bonding pads and the other ends projecting beyond one edges of the first and second semiconductor chips and films; an adhesive member interposed between the first connection members and the second connection members; and via patterns passing through the adhesive member and connecting projecting portions of the redistribution lines of the first and second connection members with each other.

The first bonding pads and the second bonding pads may be disposed in line on center portions of the first semiconductor chip and the second semiconductor chip.

In another embodiment of the present invention, a stack package includes: a substrate having first and second bond fingers; at least two chip units stacked on the substrate, and each including a first semiconductor chip and a second semiconductor chip disposed such that their surfaces for forming first bonding pads and second bonding pads face each other, first and second connection members disposed on the surfaces of the first and second semiconductor chips for forming the first and second bonding pads, and having redistribution lines which have one ends connected with the first and second bonding pads and the other ends projecting beyond one edges of the first and second semiconductor chips and films, an adhesive member interposed between the first connection members and the second connection members, and via patterns passing through the adhesive member and connecting projecting portions of the redistribution lines of the first and second connection members with each other; third connection members electrically connecting a lowermost chip unit among the stacked at least two chip units with the first bond fingers of the substrate, and the stacked chip units with one another; and fourth connection members electrically connecting an uppermost chip unit among the stacked at least two chip units and the second bond fingers of the substrate.

The third connection members may include bumps or solders.

The fourth connection members may include conductive wires.

The uppermost chip unit among the stacked at least two chip units may be stacked such that the projecting portions of the redistribution lines of the first and second connection members of the uppermost chip unit are oppositely disposed compared to those of the other chip units stacked under the uppermost chip unit.

In another embodiment of the present invention, a chip unit includes: a first semiconductor chip and a second semiconductor chip disposed such that their the other surfaces facing away from their one surfaces for forming first bonding pads and second bonding pads face each other; first and second connection members disposed on the surfaces of the first and second semiconductor chips for forming the first and second bonding pads, and having redistribution lines which have one ends connected with the first and second bonding pads and the other ends projecting beyond one edges of the first and second semiconductor chips and films; and via patterns passing through the first and second connection members and connecting projecting portions of the redistribution lines of the first and second connection members with each other.

The chip unit may further include: an adhesive member interposed between the first semiconductor chip and the second semiconductor chip.

The first bonding pads and the second bonding pads may be disposed in line on center portions of the first semiconductor chip and the second semiconductor chip.

In another embodiment of the present invention, a stack package includes: a substrate having bond fingers; at least two chip units stacked on the substrate, and each including a first semiconductor chip and a second semiconductor chip disposed such that their the other surfaces facing away from their one surfaces for forming first bonding pads and second bonding pads face each other, first and second connection members disposed on the surfaces of the first and second semiconductor chips for forming the first and second bonding pads, and having redistribution lines which have one ends connected with the first and second bonding pads and the other ends projecting beyond one edges of the first and second semiconductor chips and films, and via patterns passing through the first and second connection members and connecting projecting portions of the redistribution lines of the first and second connection members with each other; and connection members connecting a lowermost chip unit among the stacked chip units with the substrate, and the chip units with one another.

The chip units may be stacked in step-like shapes such that the projecting portions of the redistribution lines are exposed.

The chip units stacked in the step-like shapes may include conductive wires for electrically connecting the projecting portions of the redistribution lines.

DESCRIPTION OF SPECIFIC EMBODIMENTS

According to an embodiment of the present invention, after preparing two semiconductor chips with center type pads, the two semiconductor chips are placed to face each other in such a manner that their center type pads define, for example, mirror image symmetry with respect to each other, and a resultant structure is molded using a flexible material such as an RCC (resin coated copper foil) and a resin containing a metallic material, as a result of which a chip unit is formed.

By forming the chip unit in this way, since the center type pads of the two semiconductor chips are electrically connected with each other, the two semiconductor chips can function as one driving chip unit.

As a consequence, in an embodiment of the present invention, as the chip unit is formed as described above, it is possible to form a stack package with a high capacity and a small thickness.

Further, in an embodiment of the present invention, when forming the chip unit, since the soft properties of the flexible material such as the RCC and the resin containing a metallic material are used, damage to the semiconductor chips can be minimized during a subsequent sawing process.

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
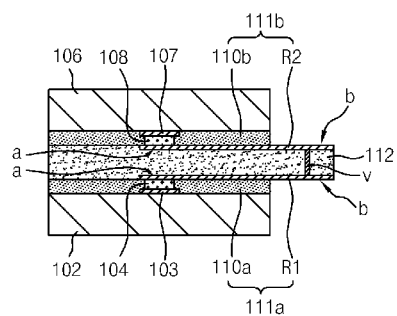
FIG. 1 is a cross-sectional view illustrating a chip unit in accordance with an embodiment of the present invention.

Referring to FIG. 1, a chip unit 120 in accordance with an embodiment of the present invention includes a first semiconductor chip 102 and a second semiconductor chip 106 which are separately placed such that their respective surfaces for forming first bonding pad 103 and second bonding pads 107 face each other.

The chip unit 120 further includes first connection members 111a and second connection members 111b which have redistribution lines R1 and R2 connected with the first and second bonding pads 103 and 107 and projecting beyond one edge of the first and second semiconductor chips 102 and 106. The chip unit 210 further comprises films 110a and 110b, an adhesive member 112 which is interposed between the first connection members 111a and the second connection members 111b, and via patterns V which pass through the adhesive member 112 and connect the projecting portions of the redistribution lines R1 and R2 with each other.

As described above, the first semiconductor chip 102 and the second semiconductor chip 106 are separately placed such that their respective surfaces, on which the first bonding pad 103 and the second bonding pads 107 are formed, face each other.

The first bonding pad 103 is formed on the first bonding pad forming surface of the first semiconductor chip 102, and first connection terminal 104 is formed on the first bonding pad 103. The second bonding pad 107 is formed on the second bonding pad forming surface of the second semiconductor chip 106, and second connection terminal 108 is formed on the second bonding pad 107.

The first and second connection terminals 104 and 108 may include, for example, bumps. The first and second bonding pads 103 and 107 are center type pads which are disposed in line on the center portions of the first semiconductor chip 102 and the second semiconductor chip 106.

While not shown in detail, the first bonding pad forming surface and the second bonding pad forming surface may be understood as active surfaces on which a plurality of elements may be formed.

The first and second connection members 111a and 111b are disposed over the first bonding pad forming surface of the first semiconductor chip 102 and the second bonding pad forming surface of the second semiconductor chip 106, respectively. One end 'a' of the first and second connection members 111a and 111b are connected to the first and second bonding pads 103 and 107, and an other end 'b' of the first and second connection members 111a and 111b project beyond the one edges of the first and second semiconductor chips 102 and 106.

For purposes of brevity, the redistribution line R1 and the film 110a corresponding to the first connection member 111a will be referred to as 'first redistribution line' and a 'first film'. The 'first redistribution line' and the 'first film' will be designated by the same reference symbols R1 and 110a, respectively.

Further, the redistribution line R2 and the film 110b corresponding to the second connection member 111b will be referred to as 'second redistribution line' and a 'second film', respectively.

The first and second connection members 111a and 111b may comprise a flexible material which has soft properties that may be found in a material such as, for example resin. Further, the material may have adhesion properties at a temperature of 100° C. or over.

Unlike this, the first and second connection members 111a and 111b may include an RCC (resin coated copper foil) or a resin containing a metallic material.

The adhesive member 112 interposed between the first connection member 111a and the second connection member 111b may comprise a resin.

The via patterns V are formed to pass through the adhesive member 112. The via patterns V may also electrically connect the projecting portions of the first and second redistribution lines R1 and R2 of the first and second connection members 111a and 111b.

As is apparent from the above description, in the embodiment of the present invention, after preparing two semiconductor chips with center type pads, the two semiconductor chips are placed to face each other in such a manner that their center type pads confront each other. A chip unit is formed through molding by using a flexible material, for example, such as an RCC and a resin containing a metallic material. Since the center type pads of the two semiconductor chips are electrically connected with each other, the two semiconductor chips can function as one driving chip unit.

As a consequence, in the present invention, because the two semiconductor chips can function as one driving unit, it is possible to form a stack package with a high capacity and a small thickness.

Further, in the present invention, since first and second semiconductor chips can be molded using resin and the flexible material such as the RCC when forming the chip unit, occurrence of a fail, such as warpage and cracks, in the semiconductor chips can be minimized during a sawing process which may be performed before picking up the semiconductor chips. Such failures may be minimized by virtue of the properties of the flexible material.

Figure 2:
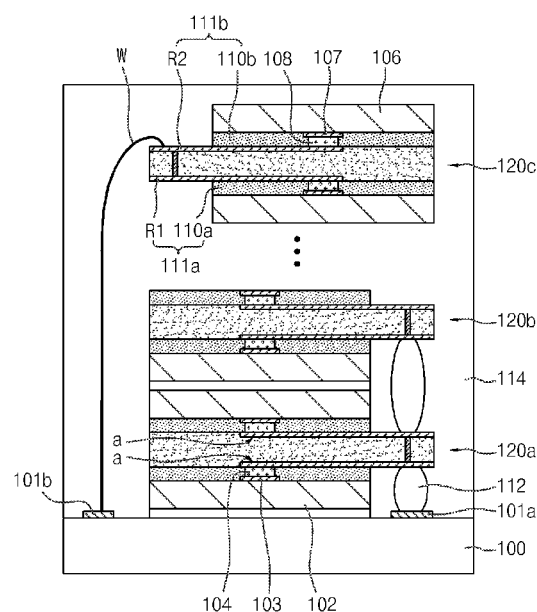
FIG. 2 is a cross-sectional view illustrating a stack package having the chip unit in accordance with an embodiment of the present invention.

FIG. 2 is a cross-sectional view illustrating a stack package having the above-described chip unit in accordance with the embodiment of the present invention.

Referring to FIG. 2, a substrate 100 having first and second bond fingers 101a and 101b is prepared. At least two chip units 120a,b,c, each of which has the same construction as mentioned in the above as relates to FIG. 1, are stacked on the substrate 100. The at least two chip units 120a,b,c are stacked, for example, in a vertical direction.

The component elements of the chip units 120a,b,c are the same as those shown in chip unit 120 illustrated in FIG. 1 and are designated herein by the same reference symbols. Further, detailed descriptions of the component elements the same as those shown in FIG. 1 will be omitted herein.

Third connection members 112 are disposed in such a way as to electrically connect a lowermost chip unit 120a among the stacked at least two chip units 120a,b,c with the first bond finger 101a of the substrate 100 and the stacked chip units 120a,b,c with one another. The third connection members 112 can include bumps or solders.

Fourth connection member W is disposed on the substrate 100 in such a way as to electrically connect an uppermost chip unit 120c among the stacked at least two chip units 120a,b,c with the second bond finger 101b of the substrate 100. The fourth connection member W can include conductive wires.

The uppermost chip unit 120b among the stacked at least two chip units 120a,b,c is stacked such that the projecting portions of the first and second redistribution lines R1 and R2 of the first and second connection members 111a and 111b of the uppermost chip unit 120c are oppositely disposed compared to those of the other chip units 120a,b,c stacked under the uppermost chip unit 120c.

An encapsulation member 114 is formed on the substrate 100 in such a way as to cover the stacked at least two chip units 120a,b,c including the substrate 100. The encapsulation member 114 can include, for example, an EMP (epoxy molding compound).

Figure 3:
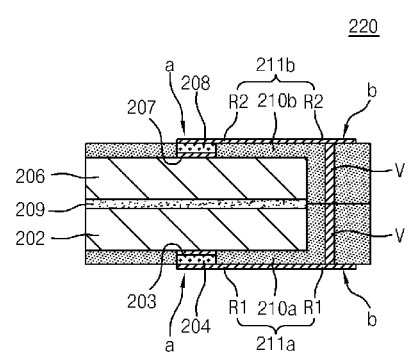
FIG. 3 is a cross-sectional view illustrating a chip unit in accordance with another embodiment of the present invention.

FIG. 3 is a cross-sectional view illustrating a chip unit in accordance with another embodiment of the present invention.

Referring to FIG. 3, a chip unit 220 in accordance with another embodiment of the present invention includes a first semiconductor chip 202 and a second semiconductor chip 206 which each have a surface for forming a bonding pad. The first semiconductor chip 202 may comprise a first bonding pad 203, and a first opposite surface that faces away from the surface for forming the bonding pad 203. The second semiconductor chip 206 may comprise a second bonding pad 207, and a second opposite surface that faces away from the surface for forming the second bonding pad 207. The chip unit 220 may be configured such that the first opposite surface and the second opposite surface face each other.

The chip unit 220 further includes first connection members 211a and second connection members 211b which may comprise redistribution lines R1 and R2 which may be connected with the first and second bonding pads 203 and 207. The redistribution lines R1 and R2 may project beyond one edge of the first and second semiconductor chips 202 and 206 and films 210a and 210b, and via patterns V which pass through to the first connection members 211a and the second connection members 211b. The via patterns V may also connect the projecting portions of the redistribution lines R1 and R2 of the first and second connection members 211a and 211b with each other.

The first semiconductor chip 202 and the second semiconductor chip 206 are attached to each other by an adhesive member 209 in such a manner that their one surfaces for forming the first bonding pads 203 and the second bonding pads 207 do not face each other but face away from each other, for example. The adhesive member 209 may include, for example, a resin with adhesion properties.

The first bonding pad 203 and the second bonding pad 207 are formed on a first bonding pad forming surface of the first semiconductor chip 202 and a second bonding pad forming surface of the second semiconductor chip 206, and first and second connection terminals 204 and 208 are formed on the first and second bonding pads 203 and 207.

The first and second connection terminals 204 and 208 may include, for example, bumps. The first and second bonding pads 203 and 207 are center type pads which are disposed in line on the center portions of the first semiconductor chip 202 and the second semiconductor chip 206.

The first and second connection members 211a and 211b are disposed over the first bonding pad forming surface of the first semiconductor chip 202 and the second bonding pad forming surface of the second semiconductor chip 206, respectively.

One end 'a' of the first and second connection members 211a and 211b are connected to the first and second bonding pads 203 and 207, and an other end 'b' of the first and second connection members 211a and 211b project beyond the one edge of the first and second semiconductor chips 202 and 206.

For the sake of easy explanation of the present embodiment of the invention, the redistribution lines and the film corresponding to the first connection members 211a will be respectively referred to as 'first redistribution lines' and a 'first film'. The 'first redistribution lines' and the 'first film' will be designated by the same reference symbols R1 and 210a, respectively. The redistribution lines and the film corresponding to the second connection members 211b will be respectively referred to as 'second redistribution lines' and a 'second film'. The 'second redistribution lines' and the 'second film' will be designated by the same reference symbols R2 and 210b, respectively.

The first and second connection members 211a and 211b may include a material which has soft properties, as described above with reference to FIG. 1. The first and second connection members 211a and 211b, however, may include an RCC or a resin containing a metallic material.

The material and the properties of the first and second connection members 211a and 211b are the same as those of the first and second connection members 111a and 111b described above in FIG. 1, and therefore, detailed descriptions thereof will be omitted herein.

The via patterns V are formed to pass through the first and second connection members 211a and 211b. The via patterns V may also electrically connect the projecting portions of the first and second redistribution lines R1 and R2 of the first and second connection members 211a and 211b. The via patterns V include a metallic material.

Figure 4:
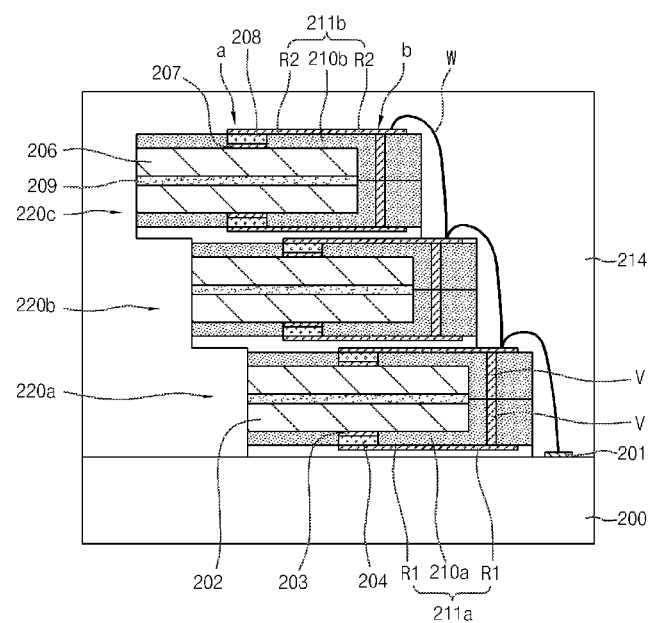
FIG. 4 is a cross-sectional view illustrating a stack package having a chip unit in accordance with another embodiment of the present invention.

FIG. 4 is a cross-sectional view illustrating a stack package having the chip unit in accordance with another embodiment of the present invention.

Referring to FIG. 4, a substrate 200 having a bond finger 201 is prepared. At least two chip units 220a,b,c, each of which has the same construction as seen in FIG. 3, are stacked on the substrate 100.

Connection members W are disposed between a lowermost chip unit 220a of the stacked chip units 220 and the substrate 200 and between the chip units 220a,b,c and electrically connect the lowermost chip unit 220a with the substrate 200 and the chip units 220a,b,c with one another.

The component elements of the chip unit 220 are the same as those shown in FIG. 3 and are designated herein by the same reference symbols. Further, detailed descriptions of the component elements the same as those shown in FIG. 3 will be omitted herein.

The stacked at least two chip units 220a,b,c may be stacked, for example, in step-like shapes as shown in FIG. 4, such that projecting portions of the redistribution lines are exposed.

Figure 5:
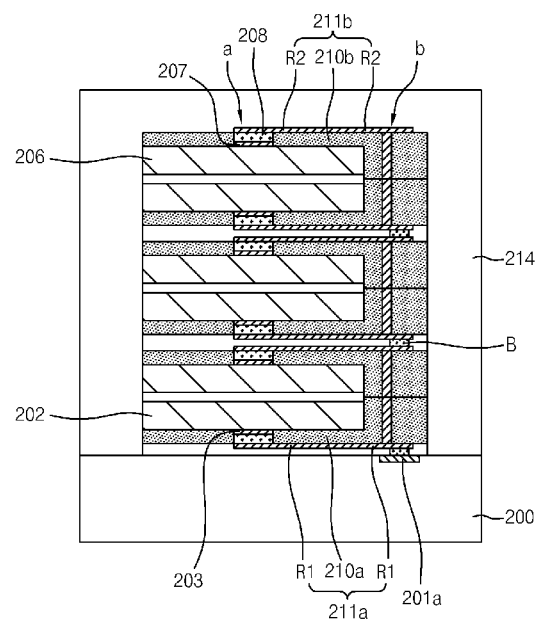
FIG. 5 is a cross-sectional view illustrating a stack package having a chip unit in accordance with another embodiment of the present invention.
Figure 6:
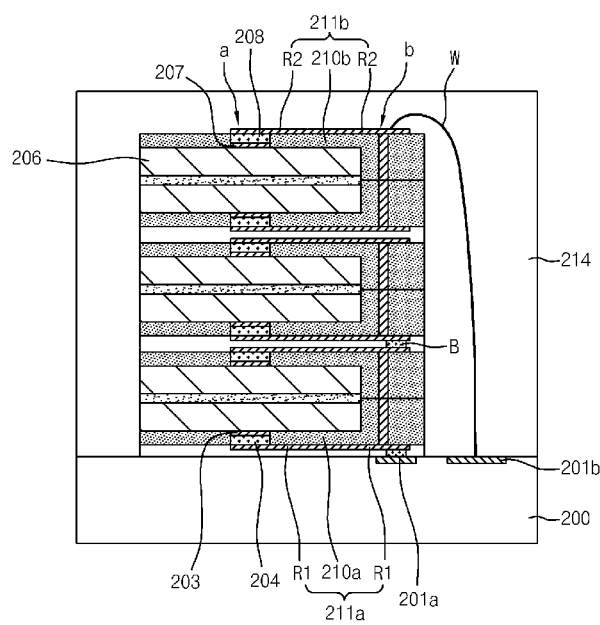
FIG. 6 is a cross-sectional view illustrating a stack package having a chip unit in accordance with another embodiment of the present invention.

Unlike this, The stacked at least two chip units 220a,b,c may be stacked vertically as shown in FIGS. 5 and 6. The vertically stacked chip units 220a,b,c may be electrically connected with one another by bumps or solders B or conductive wires W. The reference numeral 214 seen in FIGS. 4, 5 and 6 designates an encapsulation member.

Figure 7:
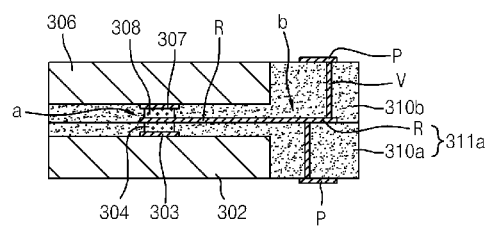
FIG. 7 is a cross-sectional view illustrating a chip unit in accordance with another embodiment of the present invention.

FIG. 7 is a cross-sectional view illustrating a chip unit in accordance with another embodiment of the present invention.

Referring to FIG. 7, a chip unit 320 in accordance with another embodiment of the present invention is realized in such a manner that the second redistribution lines R2 and the adhesive member 112 in the chip unit 120 depicted in FIG. 1 are omitted. The chip unit 320 may have a first semiconductor chip 302 and a second semiconductor chip 306 which are stacked vertically in such a manner that first connection terminal 304 on first bonding pad 303 and second connection terminal 308 on second bonding pad 307 face each other while a redistribution line R is interposed therebetween.

That is to say, the chip unit 320 in accordance with the present embodiment of the invention includes first connection members 311a which has the redistribution line R and a first film 310a and second connection members which do not have any redistribution lines and only have a second film 310b.

In detail, the chip unit 320 in accordance with the present embodiment of the invention includes the first semiconductor chip 302 and the second semiconductor chip 306 which are disposed such that their surfaces for forming the first bonding pads 303 and the second bonding pads 307 face each other.

Therefore, the chip unit 320 includes first connection member 311a which has the redistribution line R connected with the first and second bonding pads 303 and 307 and projecting beyond one edges of the first and second semiconductor chips 302 and 306 and the first film 310a. The chip unit 320 may further comprise a second connection member which does not have any redistribution lines and only has second film 310b, pads P which are formed on upper surfaces of projecting and exposed portions of the first connection member 311a and the second connection members. The chip unit 320 may also comprise via patterns V which pass through the first connection member 311a and the second connection member and connect the pads P, formed on the upper surfaces of the projecting and exposed portions of the first connection members 311a and the second connection members, with the redistribution line R of the first connection member 311a.

The other component elements of the chip unit 320 are the same as those shown in FIGS. 1 and 3, and therefore, detailed descriptions thereof will be omitted herein.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A chip unit comprising:
a first semiconductor chip comprising a first surface for forming a first bonding pad and a second semiconductor chip comprising a second surface for forming a second bonding pad, wherein the first and second semiconductor chips are disposed such that the first surface and second surface face each other;
first connection member disposed on the first surface and having a redistribution line which has one end connected with the first bonding pad and another end projecting beyond an edge of the first semiconductor chip;
second connection member disposed on the second surface, and having a redistribution line which has one end connected with the second bonding pad and another end projecting beyond an edge of the second semiconductor chip;
an adhesive member adhering the first connection member and the second connection member; and
via patterns passing through the adhesive member and electrically connecting a projecting portion of the redistribution line of the first connection member with a projecting portion of the redistribution line of the second connection member.

2. The chip unit according to claim 1, wherein the first bonding pads are disposed in line on a center portion of the first semiconductor chip, and the second bonding pads are disposed in line on a center portion of the second semiconductor chip.

3. The semiconductor unit according to claim 1, wherein each of the first connection member and the second connection member further comprise film, wherein the film of the first connection member is formed on the first surface in such a way as to expose the first bonding pad, and the film of the second connection member is formed on the second surface in such a way as to expose the second bonding pad.

4. A stack package comprising:
a substrate having a first and a second bond finger;
at least two chip units stacked on the substrate, wherein each of the chip units comprises:

a first semiconductor chip comprising a first surface for forming a first bonding pad and a second semiconductor chip comprising a second surface for forming a second bonding pad, wherein the first and second semiconductor chips are disposed such that the first surface and second surface face each other;

first connection member disposed on the first surface and having a redistribution line which has one end connected with the first bonding pad and another end projecting beyond an edge of the first semiconductor chip;

second connection member disposed on the second surface, and having a redistribution line which has one end connected with the second bonding pad and another end projecting beyond an edge of the second semiconductor chip;

an adhesive member adhering the first connection member and the second connection member; and a via pattern passing through the adhesive member and electrically connecting a projecting portion of the redistribution line of the first connection member with a projecting portion of the redistribution line of the second connection member;

a third connection member electrically connecting a lowermost chip unit among the stacked chip units with a first bond finger of the substrate, and the stacked chip units with one another; and fourth connection member electrically connecting an uppermost chip unit among the stacked chip units and a second bond finger of the substrate.

5. The stack package according to claim 4, wherein the third connection member comprises bumps or solders.

6. The stack package according to claim 4, wherein the fourth connection member comprise conductive wires.

7. The stack package according to claim 4, wherein the uppermost chip unit is stacked such that the projecting portions of the redistribution lines of the first and second connection members of the uppermost chip unit are oppositely disposed compared to those of the other chip units stacked under the uppermost chip unit.

8. The stack package according to claim 4, further comprising an encapsulation member formed on the substrate in such a way as to cover the stacked chip units including the substrate.

9. A chip unit comprising:
a first semiconductor chip comprising a first surface for forming a first bonding pad and a second surface which faces away from the first surface, a second semiconductor chip comprising a third surface for forming a second bonding pad and a fourth surface which faces away from the third surface, wherein the first and second semiconductor chips are disposed such that the second surface and the fourth surface face each other;

first connection member disposed on the first surface and projecting beyond an edge of the first semiconductor chip to cover a side surface of the first semiconductor chip, and having a redistribution line which has one end connected with the first bonding pad and the other end projecting beyond the edge of the first semiconductor chip;

second connection member disposed on the third surface and projecting beyond an edge of the second semiconductor chip to cover a side surface of the second semiconductor chip, and having a redistribution line which has one end connected with the second bonding pad and another end projecting beyond the edge of the second semiconductor chip; and via patterns passing through projecting portions of the first and second connection members and electrically connecting a projecting portion of the redistribution line of the first connection member with a projecting portion of the redistribution line of the second connection member.

10. The chip unit according to claim 9, further comprising an adhesive member adhering the second surface of the first semiconductor chip, and the fourth surface of the second semiconductor chip.

11. The chip unit according to claim 9, wherein the first bonding pads are disposed in line on a center portion of the first semiconductor chip, and the second bonding pads are disposed in line on a center portion of the second semiconductor chip.

12. The chip unit according to claim 9, wherein each of the first connection member and the second connection member further comprise film, wherein the film of the first connection member is formed on the first surface in such a way as to expose the first bonding pad and projects beyond an edge of the first semiconductor chip to cover the side surface of the first semiconductor chip, and the film of the second connection member is formed on the second surface in such a way as to expose the second bonding pad and projects beyond the edge of the second semiconductor chip to cover the side surface of the second semiconductor chip.

13. A stack package comprising:
a substrate comprising at least one bond finger;
at least two chip units stacked on the substrate, wherein each of the chip units comprises:
a first semiconductor chip comprising a first surface for forming a first bonding pad and a second surface which faces away from the first surface, a second semiconductor chip comprising a third surface for forming a second bonding pad and a forth surface which faces away from the third surface, wherein the first and the second semiconductor chips are disposed such that the second surface and the fourth surface face each other;

first connection member disposed on the first surface and projecting beyond edge of the first semiconductor chip to cover a side surface of the first semiconductor chip, and having redistribution line which has one end connected with the first bonding pad and the other end projecting beyond the edge of the first semiconductor chip;

second connection member disposed on the third surface and projecting beyond edge of the second semiconductor chip to cover a side surface of the second semiconductor chip, and having redistribution line which has one end connected with the second bonding pad and the other end projecting beyond the edge of the second semiconductor chip; and via pattern passing through projecting portion of the first and second connection members and electrically connecting projecting portion of the redistribution line of the first connection member with projecting portion of the redistribution line of second connection member; and connection member connecting a lowermost chip unit among the stacked chip units with the substrate, and the chip units with one another.

14. The stack package according to claim 13, wherein the chip units are stacked in step-like shapes such that the projecting portions of the redistribution lines are exposed.

15. The stack package according to claim 13, wherein the chip units stacked in the step-like shapes include conductive wires for electrically connecting the projecting portions of the redistribution lines.

16. The stack package according to claim 13, further comprising an encapsulation member formed on the substrate in such a way as to cover the stacked chip units including the substrate.

* * * * *